US006362509B1

(12) United States Patent
Hart

(10) Patent No.: US 6,362,509 B1
(45) Date of Patent: Mar. 26, 2002

(54) FIELD EFFECT TRANSISTOR WITH ORGANIC SEMICONDUCTOR LAYER

(75) Inventor: Cornelis Maria Hart, Eindhoven (NL)

(73) Assignee: U.S. Philips Electronics, New York, NY (US)

( * ) Notice: Subject to any disclaimer, the term of this patent is extended or adjusted under 35 U.S.C. 154(b) by 0 days.

(21) Appl. No.: 09/684,301

(22) Filed: Oct. 6, 2000

(30) Foreign Application Priority Data

Oct. 11, 1999 (EP) .............................. 99203334

(51) Int. Cl.[7] ......................... H01L 29/76; H01L 29/94
(52) U.S. Cl. ...................... 257/369; 257/40; 257/202; 438/99
(58) Field of Search .................. 257/40, 202, 208, 257/307, 369; 438/99

(56) References Cited

U.S. PATENT DOCUMENTS

| 3,588,635 A | * | 6/1971 | Medwin ................. 257/369 |
| 4,084,173 A | * | 4/1978 | Fantechi ................ 257/369 |
| 4,775,880 A | * | 10/1988 | Suzuki et al. ............ 348/302 |
| 4,959,430 A | | 9/1990 | Jonas et al. ............. 526/257 |
| 5,079,614 A | * | 1/1992 | Khatakhotan ............ 257/369 |
| 5,866,938 A | * | 3/1999 | Haukness ............... 365/205 |
| 6,114,732 A | * | 9/2000 | Sugimura et al. ......... 257/365 |

FOREIGN PATENT DOCUMENTS

| EP | 0628560 A1 | 5/1994 | ......... C07D/495/04 |
| WO | WO9910939 | 3/1999 | ........... H01L/51/00 |

OTHER PUBLICATIONS

Khatakhotan, Interleaved Channeless Gate Array Architecture, IEEE 1992 Custom Integrated Circuits Conf., 1992, 27.1.1.*
Polymeric Integrated Circuits and Light–Emitting Diodes, D>M de Leeuw et al, Philips Research Laboratories.

* cited by examiner

Primary Examiner—Richard Elms
Assistant Examiner—Christian Wilson
(74) Attorney, Agent, or Firm—Daniel J. Piotrowski

(57) ABSTRACT

The integrated circuit (1) suppresses leakage currents, which usually take place between neighboring transistors (10, 20) through the unpatterned semiconductor layer (5). In its first layer (3), the circuit (10) comprises electrically conductive tracks (4) which are in contact with the semiconductor layer (5), some of which tracks (4) are in use as source and drain electrodes (14, 15, 24, 25) and are preferably fork-shaped and interdigitated. The suppression of leakage currents is achieved by putting neighboring electrodes (14, 24) in different transistors (10, 20) at the same voltage and by excluding the presence of any other electrically conductive tracks between those neighboring electrodes (14, 24). Interconnect lines (39) carrying input or output signals are positioned in a second layer (7) as much as possible, which second layer (7) comprises electrically conductive tracks (8) and is not in contact with the semiconductor layer (5). The integrated circuit (1) of the invention is very well fitted to contain arrays of NAND structures.

10 Claims, 5 Drawing Sheets

FIELD EFFECT TRANSISTOR WITH ORGANIC SEMICONDUCTOR LAYER

The invention relates to an integrated circuit comprising a substrate with an electrically insulating surface, on which surface are present:
- an insulating layer;
- a semiconducting layer which is at least substantially unpatterned;
- a first patterned layer comprising a pattern of electrodes and other electrical conductors; and
- a second patterned layer which comprises a pattern of electrical conductors and which is separated from the first patterned layer and from the semiconducting layer by the insulating layer,
  - wherein the first patterned layer is in contact with the semiconducting layer and comprises a first and a second transistor, said transistors each having a first and a second electrode, of which electrodes at least the first electrodes comprise a number of electrically conducting tracks which are at least substantially parallel.

Such an integrated circuit, also referred to as IC, is known from D. M. de Leeuw et al., *IEDM* 97, 331–336. This integrated circuit is manufactured from a polymeric material and comprises combinations of field effect transistors in 2-input NAND gates and inverters. The patterned layers are manufactured from polyaniline and have electrically insulating and electrically conducting portions. The first electrode is a source electrode and the second electrode a drain electrode, or the other way round. The first and second electrodes are interdigitated: the parallel tracks of each of the electrodes lie alongside those of the other like the teeth of two forks.

A disadvantage of this circuit is the occurrence of leakage currents between transistors through the unpatterned semiconducting layer. These leakage currents hamper the independent functioning of the transistors and thus cause an interference in input and output signals of the circuit.

It is an object of the invention to provide an integrated circuit of the kind described in the opening paragraph in which the occurrence of leakage currents between transistors through the semiconducting layer is counteracted.

According to the invention, this object is achieved in that the first electrode of the first transistor and the first electrode of the second transistor both perform the same function of source and drain electrode; the circuit comprises means for giving the first electrode of the first transistor and the first electrode of the second transistor in the first patterned layer the same potential in operational condition; and the first patterned layer between the first and the second transistor is free from any electrical conductor which has a potential other than that of the first electrode of the first transistor in the operational condition.

Since the first electrodes of two transistors situated next to one another have the same potential, there is no driving force for a displacement of charge from the first electrode, for example in the first transistor, to an electrical conductor outside the first transistor. Leakage currents through the semiconducting layer are prevented thereby. An advantage of the circuit according to the invention is the fact that it is not necessary to pattern the semiconducting layer. The omission of an additional, lithographic patterning step constitutes a saving in production cost.

Reduction of leakage current between the first and the second transistor is especially important, if said transistors are part of different functional blocks. Such blocks are for example NAND- or NOR-blocks, or are blocks relating to different memory units. It is common practice in the design of integrated circuits, that neighboring blocks do not need to be related functionally. Hence, leakage current from the first transistor in a first block to the second transistor in a second block—in an integrated circuit according to the prior art—will introduce noise in the output of the second block. This noise is completely unrelated to any signal in the block itself, and will probably be a severe cause of malfunctioning of the integrated circuit. In the integrated circuit of the invention said leakage current—and hence said noise—is prevented and the signal-to-noise ratio is substantially improved.

Examples of transistors are field effect and bipolar transistors. Field effect transistors may be constructed in a thin-film shape, referred to as TFT, in the shape of a conductor-insulator-semiconductor structure, referred to as MISFET, and in the shape of a conductor-semiconductor structure, referred to as MESFET. Transistors may be used as switches and as components in a memory element.

The substrate material used may for example be silicon, quartz, glass, a ceramic material, or a polymer such as polyimide. Preferably, the substrate material is polyimide. The patterned layers preferably comprise organic polymeric material, but they may also comprise metal or inorganic conductors such as gold, silver, or doped silicon, either as the main component or in the form of a thin layer on an organic polymer material. The semiconducting layer comprises, for example, doped silicon or an organic material which is suitable as a semiconductor. The thickness of the semiconducting layer lies between approximately 5 nm and a few micrometers. The insulating layer comprises, for example, a material such as $SiO_2$, $Si_3N_4$, polyvinyl phenol, polyvinyl alcohol, or cyanoethyl pullane.

In an embodiment of the IC according to the invention, said means are an electrical conductor in the first patterned layer which interconnects the first electrodes of the first and the second transistor. Such an electrical conductor is an interconnect line. The interconnect line may connect a plurality of first electrodes in transistors to one another. Furthermore, the interconnect line may be at the same time a supply line which applies the so-called supply voltage. An alternative means is formed by an interconnect line between said first electrodes in an additional patterned layer, which interconnect line is in contact with the first patterned layer but not with the semiconducting layer. Such an interconnect line may also be separately provided.

A further embodiment is characterized in that the first electrode and the second electrode of the first transistor are interdigitated and together form a pair, which pair has a number of at least substantially parallel electrically conducting tracks; two outermost tracks of the interdigitated pair belonging to the first electrode. The second electrode is not connected to an electrode in the second transistor because of the desired independence of the first and the second transistor and the mutual interconnection of the first electrodes of these transistors. To prevent potential differences, and accordingly leakage currents, the second electrode is screened off from the electrodes in the second transistor. This screening takes place by means of conductive tracks of the first electrode, which tracks lie at an outer side of the interdigitated electrode pair. An outer side is meant to be a side here in the patterned layer where none of the electrodes of the pair is connected to another electrical conductor. A track at an outer side is an outermost track. It is possible to integrate neighboring outermost tracks in the first electrodes of the first and the second transistor into one track. An outermost track may alternatively be branched or split.

In a special embodiment of this circuit, the first electrode has at least three tracks, of which two outermost tracks are the longest. The lengthened shape optimally screens off the outermost tracks of the second electrode and the other electrical conductors connected thereto from the adjoining transistors.

In a further embodiment of the IC according to the invention, the conductor interconnecting the first electrodes is a first supply line; the first and the second transistor form part of a first NAND function block, which NAND function block in addition comprises a third transistor; the NAND function block comprises an interdigitated pair of a source and a drain electrode of the third transistor in the first patterned layer, of which pair a first electrode is connected to a second supply line, such that the NAND function block lies between the first and the second supply line in as far as this block is present in the first patterned layer; and the second supply line interconnects the first electrode of the third transistor and a first electrode of a second NAND function block. The operation of a NAND function block is known to those skilled in the art of semiconductor manufacture. One of the two supply lines has a supply voltage greater than zero, while the other one is connected to ground. This embodiment of the IC has the advantage that the NAND function block can be accommodated in a simple manner in a row of NAND function blocks. Such a row is eminently suitable for use in a memory for data storage.

In a further embodiment of the IC according to the invention, the electrical conductor which transfers signals chosen from the group of input signals and output signals to the first transistor is present in the second patterned layer. A conductor having such a function is known to those skilled in the art as signal wire. At least one signal wire is present for each transistor. Since the second patterned layer does not make contact with the at least substantially unpatterned semiconducting layer, no leakage current will flow from a signal wire to any other electrical conductor through the semiconducting layer in this embodiment. It is advantageous in the case where NAND function blocks are present in the IC when signal wires of the IC are present in the second patterned layer at the areas of the NAND function blocks. Portions of the first patterned layer may thus be kept free from electrical conductors between two transistors. If the signal wires transmitting the input or output signal to a transistor all lie in the second patterned layer, it is necessary for at least one of these signal wires to be connected to an electrical conductor in the first patterned layer. A via or vertical interconnect area achieves such a connection. To obtain a minimum contact resistance, it is favorable when the IC is given a bottom gate structure. In this structure, the second patterned layer lies first on the substrate, then the insulator, then the second patterned layer, and finally the semiconducting layer.

In another embodiment of the IC according to the invention, an auxiliary conductor in contact with one of the supply lines lies between a first and a second electrical conductor in the first patterned layer, the latter two conductors being situated outside a transistor. The auxiliary conductor acts as a leakage current trap. Normally, a leakage current would occur between the first and the second electrical conductor through the unpatterned semiconducting layer, which would affect the transmission of signals in the conductors in an uncontrolled manner. In this embodiment of the IC according to the invention, by contrast, two leakage currents occur which are both branched off to a supply line having a constant supply voltage. The two leakage currents—one leakage current between the first conductor and the auxiliary conductor and another leakage current between the second conductor and the auxiliary conductor— thus influence said signal transmission in a controlled manner or not at all. The first and the second conductor are, for example, signal wires which couple the input and supply signals of a number of transistors. Preferably, these conductors are present at a side of a supply line which is free from transistors.

In a further embodiment of the IC according to the invention, at least one patterned layer is constructed so as to have a relief structure. This embodiment prevents leakage currents between conductors in the patterned layer through the insulating portions of this layer. Preferably, both patterned layers are constructed as relief structures. Relief structures of polymeric material are known per se from WO-A 99/10939. When relief structures of polyaniline as the polymeric material are used, the conductivity of the relief structures is enhanced in that the polyaniline is doped for a second time. Preferably, the pattern in the structure comprises electrical conductors and recesses which are less than 10 $\mu$m wide. Such minute dimensions enhance the characteristics of a transistor, especially as regards the on/off ratio.

In an embodiment of the IC according to the invention, the semiconducting layer mainly comprises organic material. In a further embodiment of the IC according to the invention, at least one patterned layer comprises mainly organic polymeric material. An integrated circuit manufactured from polymeric materials has the advantage inter alia of being inexpensive. In addition, the circuit has a high flexibility in dependence on the substrate material.

Examples of organic materials which can be used for the semiconducting material are polythienylene-vinylene, polythiophene, polyphenylene-vinylene, polyfuranylenevinylene, polypyrrole, polyphenylene, polyacetylene, polyfurane, and polyaniline. Substituted variants of these polymeric materials may also be used. Examples of substituents are alkyl and alkoxy groups and groups having a ring structure such as alkylenedioxy groups. Such groups are preferably $C_1$ to $C_{10}$-alkyl, -alkoxy, or -alkylene.

Doped forms of various polymeric materials are known as electrically conducting materials. Examples of such materials are polyaniline, polyimide, polythiophene, polypyrrole, poly(p-phenylenesulfide) and copolymers of these materials. Other materials which may be used are the substituted variants of these materials. Examples of substituents are alkyl, alkoxy, and alkylalkoxy groups. Examples are in particular poly-3-alkylthiophenes, poly-3,4-dialkoxythiophenes, poly-3,4-alkylthiophenes, and poly-3, 4-alkylenedioxythiophenes, and furthermore other polythiophenes with ring-shaped substituents as known from U.S. Pat. No. 4,959,430 and EP-A 628 560. Such substituted groups are preferably $C_1$ to $C_{10}$-alkyl, -alkoxy, or -alkylenedioxy.

These and other aspects of the integrated circuit according to the invention will be explained in more detail below with reference to drawings, in which.

EMBODIMENT 1

Figure 1:
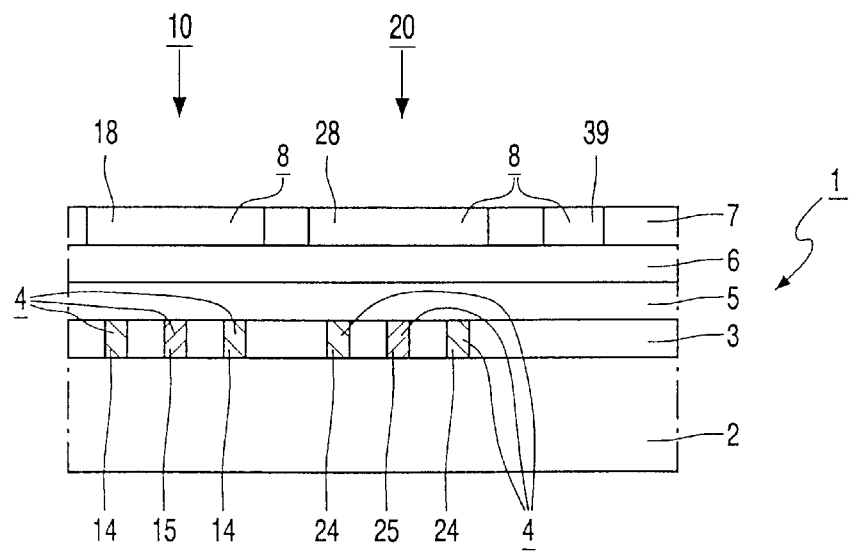
FIG. 1 is a diagrammatic cross-sectional view of a characterizing portion of a first embodiment of an IC according to the invention.

FIG. 1 is a diagrammatic cross-sectional view of a characterizing portion of an integrated circuit 1 according to the invention. Said portion comprises two transistors 10 and 20, which in this case are field effect transistors of the MISFET type. The circuit 1 comprises a substrate 2 with an electrically insulating surface. On this surface are present a first patterned layer 3 with electrical conductors 4, an unpatterned semiconducting layer 5, an insulating layer 6, and a second patterned layer 7. This layer 7 comprises electrical conductors 8 which constitute the gate electrodes 18 and 28 and the accompanying signal wires 19 and 29 of the first 10 and the second transistor 20. The electrical conductors 4 are utilized inter alia as a first electrode 14 and a second electrode 15 of the first transistor 10 and as a first electrode 24 and a second electrode 25 of the second transistor 20. The leakage current which would flow between the electrodes 14 and 24 is prevented in that these electrodes are set for the same potential. The means by which this is realized are formed by an electrical conductor which interconnects the first electrodes 14 and 24. Such a connection preferably is a first supply line 91.

Figure 2:
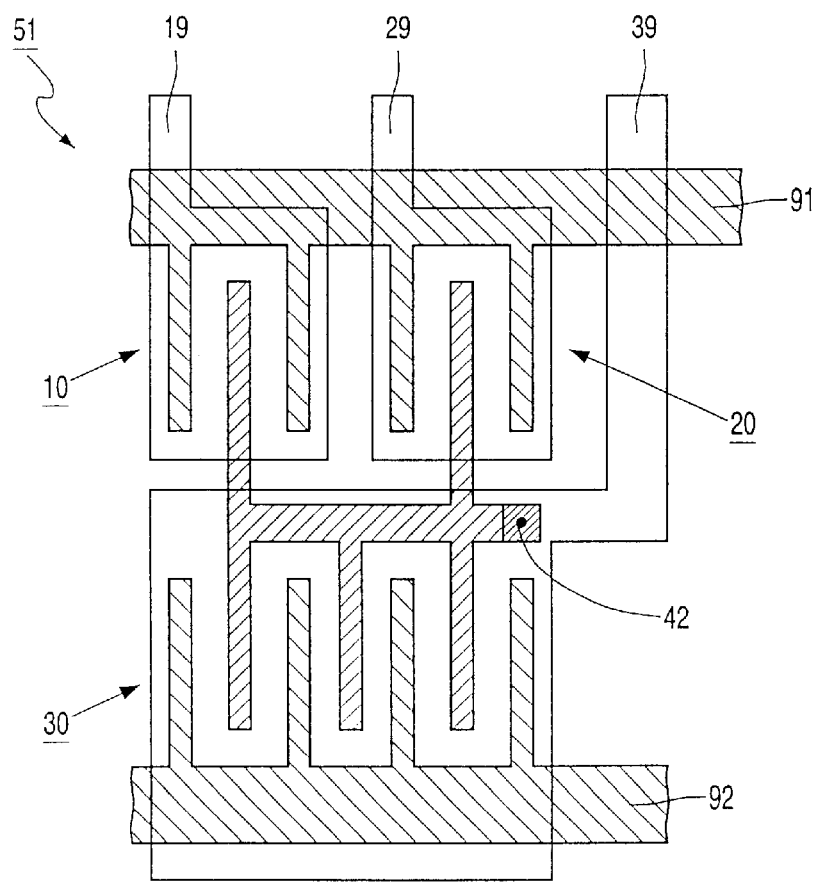
FIG. 2 is a plan view of a NAND function block in the first embodiment of an IC according to the invention.
Figure 2A:
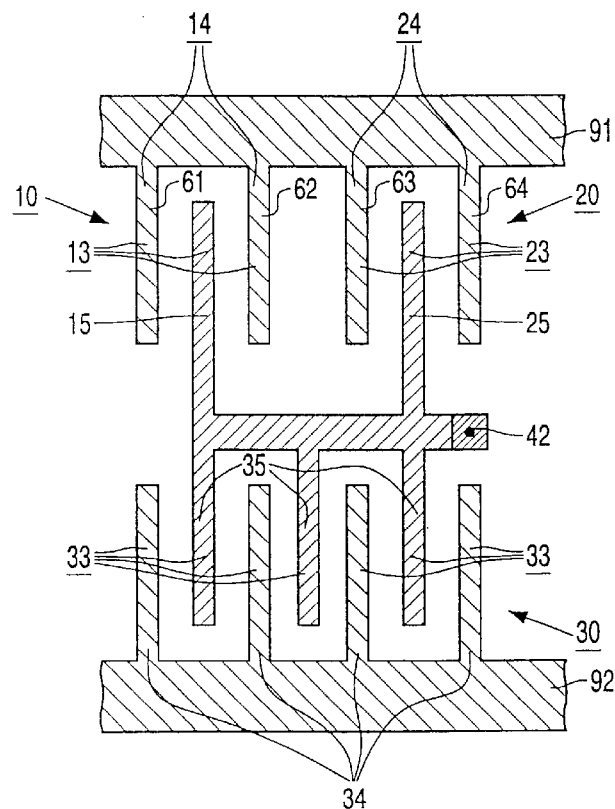
FIG. 2a is the plan view of FIG. 2 in which only the first patterned layer is depicted.
Figure 2B:
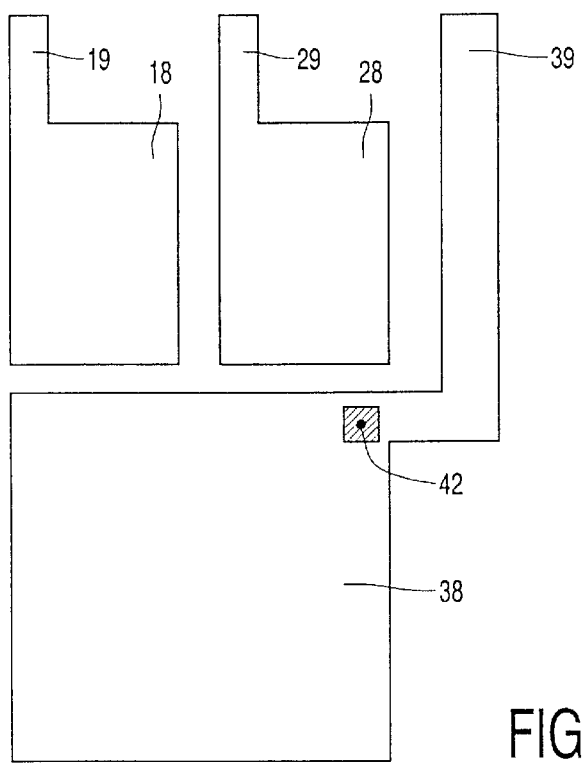
FIG. 2b is the plan view of FIG. 2 in which only the second patterned layer is depicted.
Figure 3:
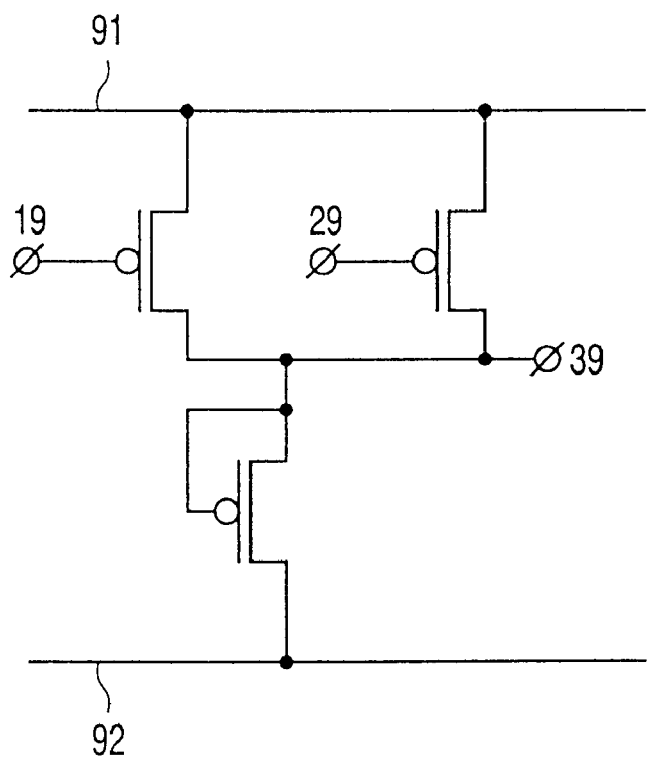
FIG. 3 is the circuit diagram of the NAND function blocks in the first embodiment of an IC according to the invention.

FIG. 2 is a plan view of a portion of the first embodiment of an IC according to the invention of which the equivalent circuit diagram is shown in FIG. 3. The substrate, the insulating layer, the semiconducting layer, and a possible protective layer are presumed to be transparent. FIG. 2a shows the first patterned layer of FIG. 2 separately. FIG. 2b shows the second patterned layer of FIG. 2 separately.

FIG. 2 shows a NAND function block 51 which is situated between the supply lines 91 and 92. The NAND function block 51 comprises three transistors 10, 20, and 30. Each of the transistors is provided with a signal wire, referenced 19, 29, and 39, respectively. The signal wire 39 is also controlled through the via (vertical interconnect area) 42.

FIG. 2a shows a pair 13 of source and drain electrodes 14, 15 of the first transistor 10. These electrodes 14, 15 are interdigitated. The transistors 20 and 30 also each comprise such an electrode pair 23, 33 comprising electrodes 24, 25; 34, 35. The electrodes 14 and 24 are connected to the supply line 91 and comprise substantially parallel electrically conducting tracks 61, 62; 63, 64. The electrode 34 is connected to the supply line 92. The electrodes 15, 25, and 35 are mutually interconnected. These electrodes 15, 25, and 35 are connected to the signal wire 39 shown in FIG. 2b through the via 42, said signal wire carrying the output signal of the NAND function block 51.

FIG. 2b further shows signal wires 19 and 29 and gate electrodes 18, 28, and 38. The position of the via 42 is also indicated. The signal wires 19, 29 each carry an input signal of the NAND function block 51. In principle, the signal may assume two values, i.e. high (or 1) and low (or 0).

The NAND function block 51 is usually only a first block in a series of independent NAND function blocks. The outermost conducting tracks 61, 64 and the outermost conducting tracks in the transistor 30, have then the function to prevent leakage currents through the semiconductor layer between conducting tracks in said independent NAND function blocks.

EMBODIMENT 2

Figure 4:
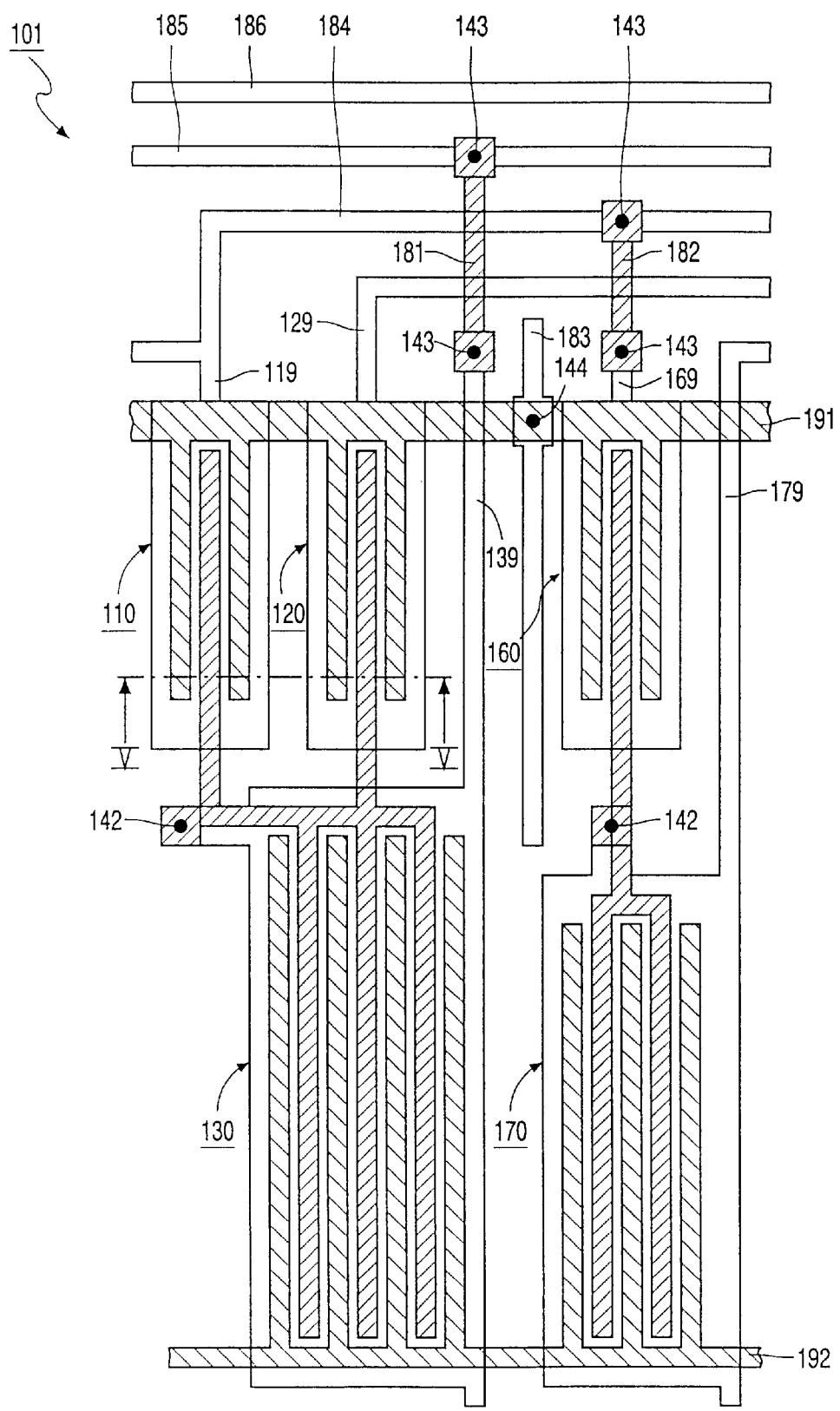
FIG. 4 is a plan view of a portion of a second embodiment of an IC according to the invention.

FIG. 4 is a plan view of a portion of the second embodiment 101 of an IC according to the invention. This Figure shows five transistors 110, 120, 130, 160, and 170 with their respective signal wires 119, 129, 139, 169, and 179. Vias 142 provide the connections. Said transistors are situated between supply lines 191 and 192. A number of electrical conductors 181, 182, 183, 184, 185, and 186 as well as vias 143 between these conductors and signal wires are also shown. The substrate, the insulating layer, the semiconducting layer, and a possible protective layer are presumed to be transparent. The first conductor 181 and the second conductor 182 both lie in the first patterned layer and are in contact with the unpatterned semiconducting layer. "The auxiliary conductor 183 lies in the second patterned layer between the second transistor 120 and the fourth transistor 160. The conductor 183 is connected with the supply line 191 through the via 144. It acts as a leakage current trap so as to prevent a leakage current between the signal wire 139 and the transistor 160, and between the signal wires 139 and 169. The signal wire 139 on the one hand and the transistor 160 and the signal wire 169 on the other hand are part of different functional blocs in the integrated circuit 1, which blocks are functionally independent. The auxiliary conductor 183 is in contact with one of the two supply lines 191, 192, with the first supply line 191 in this embodiment.

Figure 5:
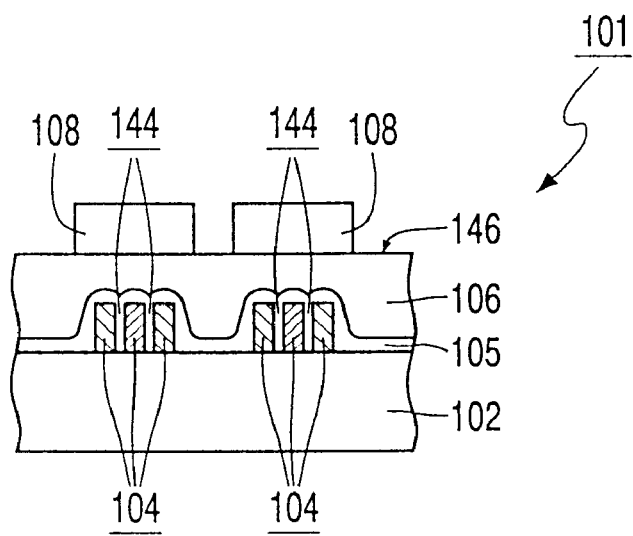
FIG. 5 is a diagrammatic cross-sectional view of the second embodiment of an IC according to the invention, taken on the line V—V in FIG. 4.

FIG. 5 is a diagrammatic cross-sectional view of the second embodiment 101 of an integrated circuit according to the invention, taken on the line V—V in FIG. 4. The first patterned layer is given a relief structure here and is provided on the substrate 102. Electrical conductors 104 are separated from one another by recesses 144. The semiconducting layer 105 is not planar because of the recesses 144. The insulating layer is accordingly formed as an insulating layer 106 with a planarized surface 146. Electrical conductors 108 are present on the planarized surface 146.

EMBODIMENT 3

Figure 6:
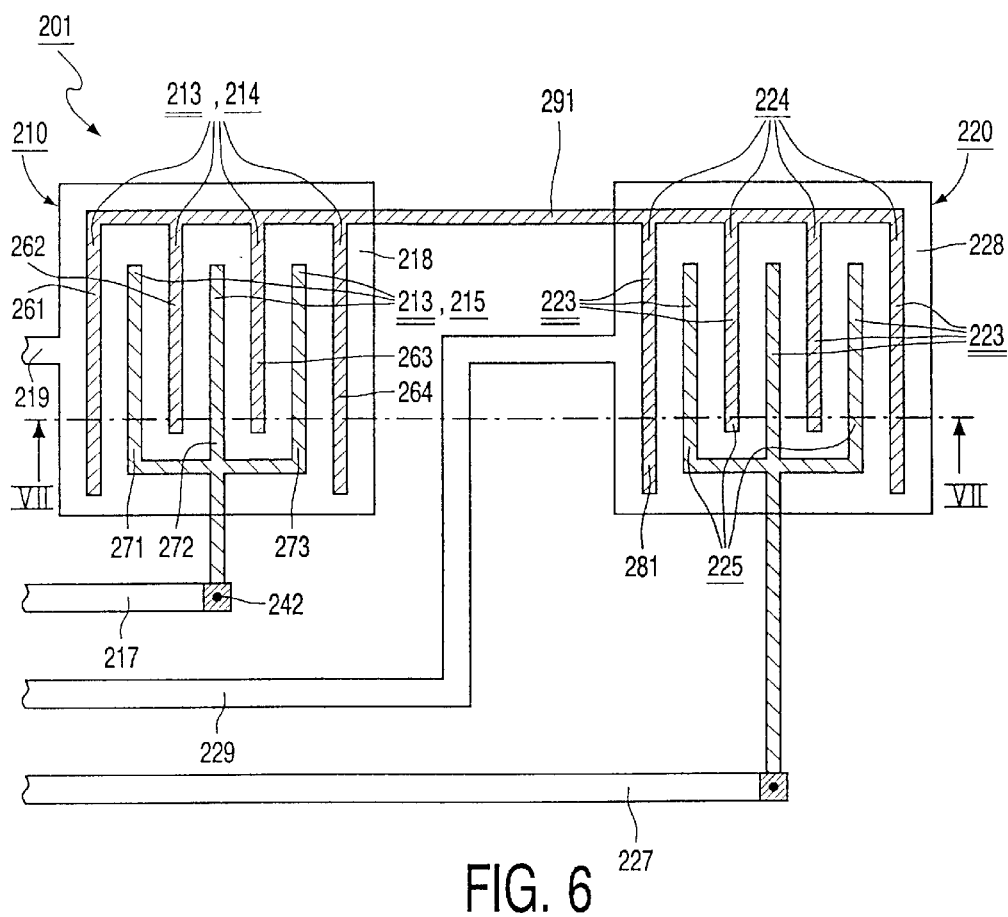
FIG. 6 is a plan view of a portion of a third embodiment of an IC according to the invention.

FIG. 6 is a plan view of a portion of a third embodiment 201 of the integrated circuit according to the invention. The substrate, the insulating layer, the semiconducting layer, and the protective layer are presumed to be transparent. The first patterned layer, shown hatched in the Figure, comprises a first and a second transistor 210, 220, each having an interdigitated electrode pair 213, 223, said pair comprising electrodes 214, 215 and 224, 225, respectively. The first electrode 214 comprises tracks 261, 262, 263, and 264; the second electrode 215 comprises tracks 271, 272, and 273. The tracks 261 and 264 are the outermost tracks of the interdigitated electrode pair 213. The first electrode 214 of the first transistor 210 is connected to the first electrode 224 of the second transistor 220 by means of an interconnect line 291. The second electrodes 215 and 225 are screened off from one another by the outermost tracks 264 and 281 of the first electrodes 214 and 224, respectively. The second patterned layer comprises an electrode 218 and signal wires 217 and 219 for the first transistor 210. The signal wire 219 transmits input signals to the first transistor 210. A second signal wire 217 transmits output signals from the first transistor 210. This signal wire 217 is connected to the second electrode 215 of the first transistor 210 in the first patterned layer by means of a via (vertical interconnect area) 242. The second patterned layer further comprises an electrode 228 and signal wires 227 and 229 of the second transistor 220.

Figure 7:
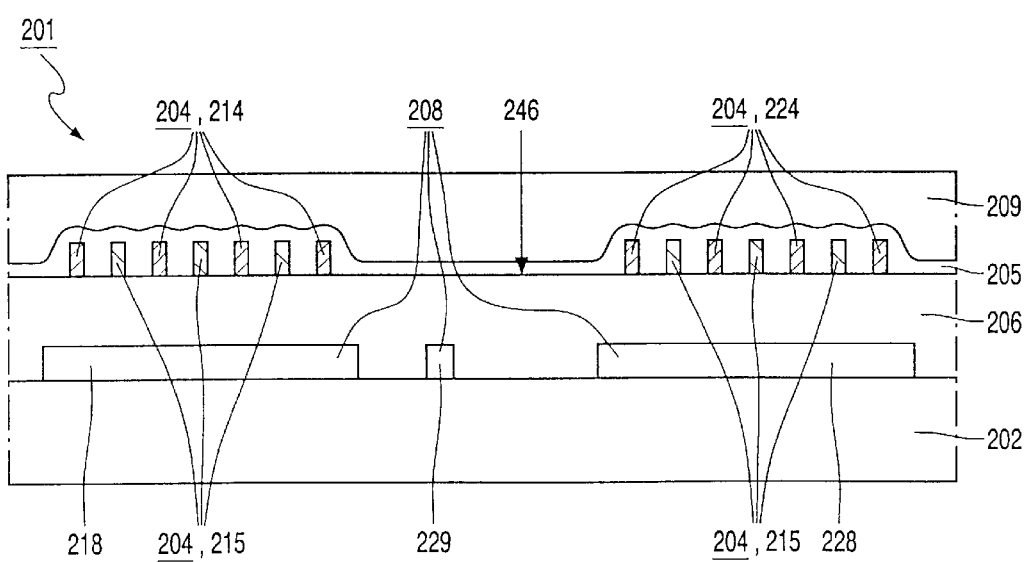
FIG. 7 is a diagrammatic cross-sectional view of the third embodiment of an IC according to the invention, taken on the line VII—VII in FIG. 6.

FIG. 7 is a diagrammatic cross-sectional view of a portion of the third embodiment 201 of an integrated circuit according to the invention, taken on the line VII—VII. In this bottom gate structure, the second patterned layer lies between the substrate 202 and the insulating layer 206. The second patterned layer in the circuit 201 is constructed as a relief structure with electrical conductors 208. The first patterned layer with relief structure 204, comprising electrodes 214 and 224, lies on the insulating layer 206 with its planarized surface 246. This structured layer is covered with a non-planar semiconducting layer 205 on which a protective layer 209 is present. The protective layer 209 protects the IC against mechanical damage, incidence of light, and/or diffusion of oxygen to the semiconducting layer. An interconnect line 229 which transmits the input signal to the electrode 228 is also present in the second patterned layer.

What is claimed is:

1. An integrated circuit (1) comprising a substrate (2) with an electrically insulating surface, on which surface are present:
   an insulating layer (6);
   a semiconducting layer (5) which is at least substantially unpatterned;
   a first patterned layer (3) comprising a pattern of electrical conductors (4); and
   a second patterned layer (7) which comprises a pattern of electrical conductors (8) and which is separated from the first patterned layer (3) and from the semiconducting layer (5) by the insulating layer (6),
      wherein the first patterned layer (3) is in contact with the semiconducting layer (5) and comprises a first (10) and a second transistor (20), said first and second transistors (10, 20) each having a first (14, 24) and a second electrode (15, 25), of which electrodes (14, 24; 15, 25) at least the first electrodes (14, 24) comprise a number of electrically conducting tracks (61, 62; 63, 64) which are at least substantially parallel, characterized in that
   the first electrode (14) of the first transistor (10) and the first electrode (24) of the second transistor (20) both perform the same function of source and drain electrode;
   the circuit (1) comprises means for giving the first electrode (14) of the first transistor (10) and the first electrode (24) of the second transistor (20) in the first patterned layer (3) the same potential in operational condition; and
   the first patterned layer (3) between the first (10) and the second transistor (20) is free from any electrical conductor which has a potential other than that of the first electrode (14) of the first transistor (10) in the operational condition.

2. An integrated circuit (1) as claimed in claim 1, characterized in that said means comprise an electrical conductor (291) in the first patterned layer (3), which conductor (291) interconnects the first electrodes (14, 24) of the first (10) and the second transistor (20).

3. An integrated circuit (201) as claimed in claim 2, characterized in that
   the first electrode (214) and the second electrode (215) of the first transistor (210) are interdigitated and together form a pair (213), which pair (213) has a number of at least substantially parallel electrically conducting tracks (261, 262, 263, 264, 271, 272, 273); and
   two outermost tracks (261, 264) of the interdigitated pair (213) belong to the first electrode (214).

4. An integrated circuit as claimed in claim 3, characterized in that the first electrode (214) has at least three tracks (261, 262, 263, 264), of which two outermost tracks (261, 264) are the longest.

5. An integrated circuit as claimed in claim 2, characterized in that
   the conductor interconnecting the first electrodes (14, 24) is a first supply line (91);
   the first (10) and the second transistor (20) form part of a first NAND function block (51), which NAND function block (51) in addition comprises a third transistor (30);
   the NAND function block (51) comprises an interdigitated pair (33) of a source and a drain electrode (34, 35) of the third transistor (30) in the first patterned layer (3), of which pair (33) a first electrode (34) is connected to a second supply line (92), such that the NAND function block (51) lies between the first (91) and the second supply line (92) in as far as this block (51) is present in the first patterned layer (3); and
   the second supply line (92) interconnects the first electrode (34) of the third transistor (30) and a first electrode of a second NAND function block.

6. An integrated circuit as claimed in claim 1, characterized in that the electrical conductor (19) which transfers signals chosen from the group of input signals and output signals to the first transistor (10) is present in the second patterned layer (7).

7. An integrated circuit (101) as claimed in claim 1, characterized in that an auxiliary conductor (183) in contact with one of the supply lines (91, 92) lies between a first (181) and a second electrical conductor (182) in the first patterned layer, the latter two conductors (181, 182) being situated outside a transistor.

8. An integrated circuit as claimed in claim 1, characterized in that at least one patterned layer (3, 7) is constructed so as to have a relief structure.

9. An integrated circuit as claimed in claim 1, characterized in that the semiconducting layer (5) mainly comprises organic material.

10. An integrated circuit as claimed in claim 1, characterized in that at least one patterned layer (3, 7) comprises mainly organic polymeric material.

* * * * *